United States Patent
Templeton et al.

[11] Patent Number: 5,658,440
[45] Date of Patent: Aug. 19, 1997

[54] SURFACE IMAGE TRANSFER ETCHING

[75] Inventors: Michael K. Templeton, Mountain View; Subhash Gupta, San Jose, both of Calif.

[73] Assignee: Advanced Micro Devices Incorporated, Sunnyvale, Calif.

[21] Appl. No.: 553,966

[22] Filed: Nov. 6, 1995

Related U.S. Application Data

[63] Continuation of Ser. No. 947,243, Sep. 18, 1992, abandoned.

[51] Int. Cl.[6] .................................................. C23C 14/34
[52] U.S. Cl. ........................... 204/192.37; 204/192.32; 204/192.36; 438/714; 438/732; 216/70
[58] Field of Search ..................... 156/643.1, 646.1, 156/659.11, 657.1, 345; 204/298.37, 298.38, 192.32, 192.35, 192.37

[56] References Cited

U.S. PATENT DOCUMENTS

| | | | |
|---|---|---|---|
| 4,745,337 | 5/1988 | Pichot et al. | 204/298.38 X |
| 4,996,077 | 2/1991 | Moslehi et al. | 204/298.38 X |

OTHER PUBLICATIONS

Lejeune, Reactive Ion Beametching of Silicon With a New Plasma Ion Source, Operated with $CF_4:SiO_2$ Over Si Selectivity and Si Surface Modification, Rev. Phys. Appl. (Mar. 1989), v.24(3), pp. 295–308.

J. Pelletier et al, "Etching mechanisms of polymers in oxygen microwave multipolar plasmas", in *Applied Physics Letters*, vol. 53(20), pp. 1914–1916 (14 Nov. 1988).

J. Pelletier et al, "Microwave plasma etching of Si and $SiO_2$ in halogen mixture:Interpretation of etching mechanisms", in *Journal of Vacuum Scince and Technology B*, vol. 7, No. 1, pp. 59–67 (Jan/Feb 1989).

*Primary Examiner*—Nam Nguyen
*Attorney, Agent, or Firm*—Benman Collins & Sawyer

[57] ABSTRACT

A process called surface image transfer etching (SITE) is used to etch patterned photoresist so as to more completely transfer a well-defined pattern formed in the top surface (10a) of a material to the bulk of the material (12). The process uses no mask, but employs only a sputter etching process where the etching rates of surfaces not normal to the ion trajectories are greatly enhanced over the etching rates of surfaces normal to the ion trajectories.

16 Claims, 2 Drawing Sheets

SURFACE IMAGE TRANSFER ETCHING

This is a continuation of application Ser. No. 07/947,243 filed on Sep. 18, 1992, abandoned.

CROSS-REFERENCE TO RELATED APPLICATION

The present application is related to application Ser. No. 07/947,242 now U.S. Pat. No. 5,308,740, filed concurrently herewith, entitled "Electrical Measurement of Sidewall Angle". In the related application, sidewall angle of, for example, patterned photoresist is determined using as part of the measuring method the surface image transfer etching process of the present invention.

TECHNICAL FIELD

The present invention relates to etching of coatings, such as photoresists, in semiconductor processing, and, in particular, relates an etching process for more complete transfer of a pattern in an upper layer to an underlying layer.

BACKGROUND ART

Resist sidewall angle impacts photoprocess performance on topography. For example, a sloped sidewall results in a large critical dimension (cd) change in a resist line going over a step in the substrate. Resist sidewall angle also impacts subsequent pattern transfer steps. For example, a sloped resist sidewall can result in a sloped sidewall in the etched material. Sometimes this is desirable, but often it is not.

It is desired to transfer a pattern, which is well-defined in the top surface of a material, more completely into the bulk of the material.

DISCLOSURE OF INVENTION

In accordance with the invention, a process is provided for transferring a pattern more completely into the bulk of the material. The process uses no mask, but employs only a sputter/chemical etching process where the etching rates of surfaces not normal to the ion trajectories are greatly enhanced over the etching rates of surfaces normal to the ion trajectories.

A high density of neutrals and ions diffuses toward a central zone where the wafer is placed. The neutrals adsorb (chemi-adsorption) on the surface but do not associatively desorb (spontaneous desorption). The ions in turn can provide the topical heating which would make the "adspecies" volatile and thus resulting in etching.

Manipulation of ion energies and trajectories along with factors which would affect "adspecies" can lead to the desired goals.

Other objects, features, and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

BEST MODES FOR CARRYING OUT THE INVENTION

Reference is now made in detail to a specific embodiment of the present invention, which illustrates the best mode presently contemplated by the inventors for practicing the invention. Alternative embodiments are also briefly described as applicable.

The process of the invention permits transfer of a pattern, which is well-defined in the top surface of a material, more completely to the bulk of the material. The process uses no mask, but employs only a sputter etching (or combination sputter/chemical etching) process where the etching rates of surfaces not normal to the ion trajectories are greatly enhanced over the etching rates of surfaces normal to the ion trajectories. The net effect of the process is to take an image delineated in the top of the resist, and transfer that image into the bulk of the material.

Figure 1:
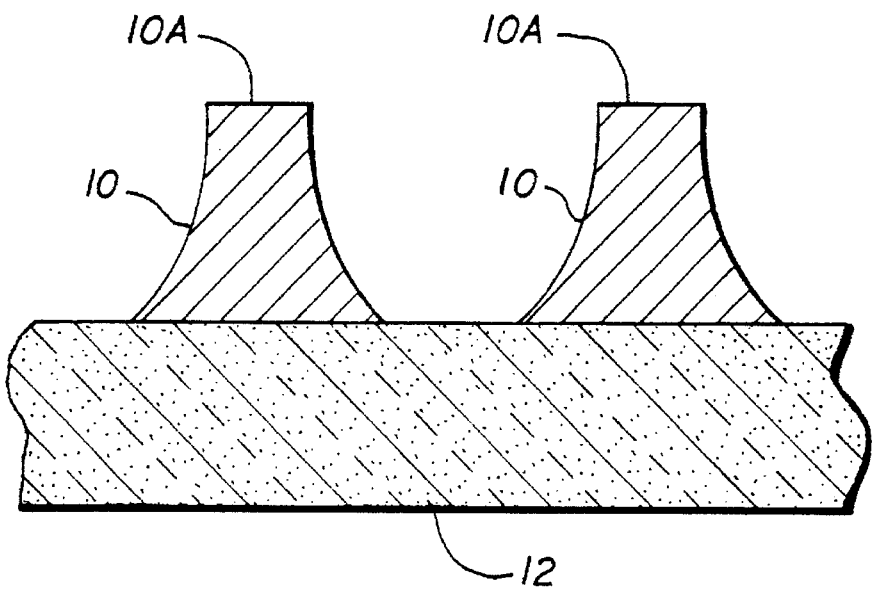
FIG. 1 is a cross-sectional view of a patterned photoresist line having a sloping sidewall, as obtained by prior art techniques.
Figure 2:
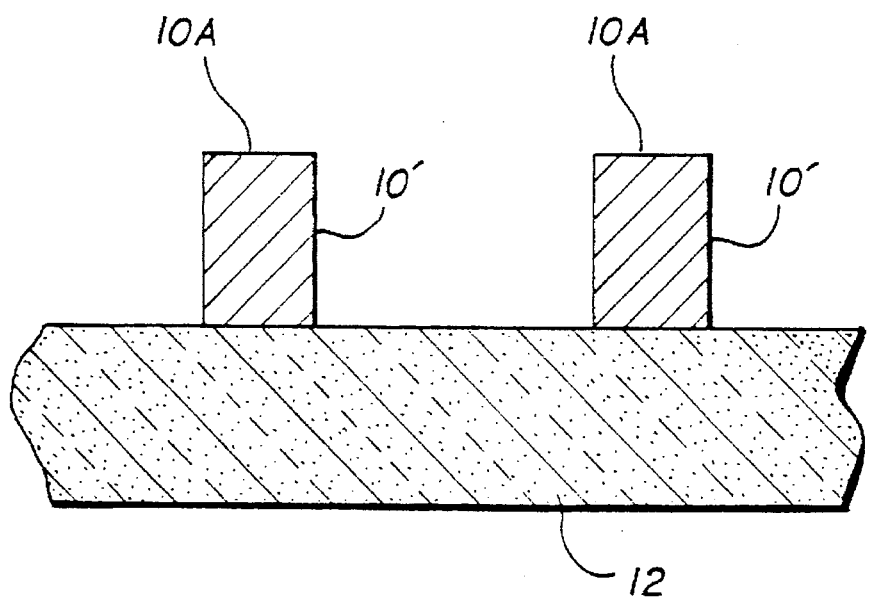
FIG. 2 is a similar view as in FIG. 1, except showing a vertical sidewall, as obtained by the process of the invention.

The concept of the process of the invention is illustrated in FIG. 1, in comparison to a prior art process, which shows a thin film 10 that is partially patterned into the bulk 12 of the material. However, the patterning is incomplete and there is substantial sidewall slope. The partially patterned surface is then subject to the etching process of the invention. After this etch, the surface pattern has been more completely transferred into the bulk of the material (see FIG. 2). The net effect of the process is to take the pattern in the top surface 10a of the material and to transfer it into the bulk of the material. In effect, this represents a self-talking, masking process. The etching process that accomplishes this surface image transfer is termed herein as a surface image transfer etch (SITE).

The principle that enables SITE is to have a very high etch rate difference between surfaces oriented normal to the trajectory of the etching ions and surfaces oriented obliquely to the trajectory of the etching ions.

Figure 3:
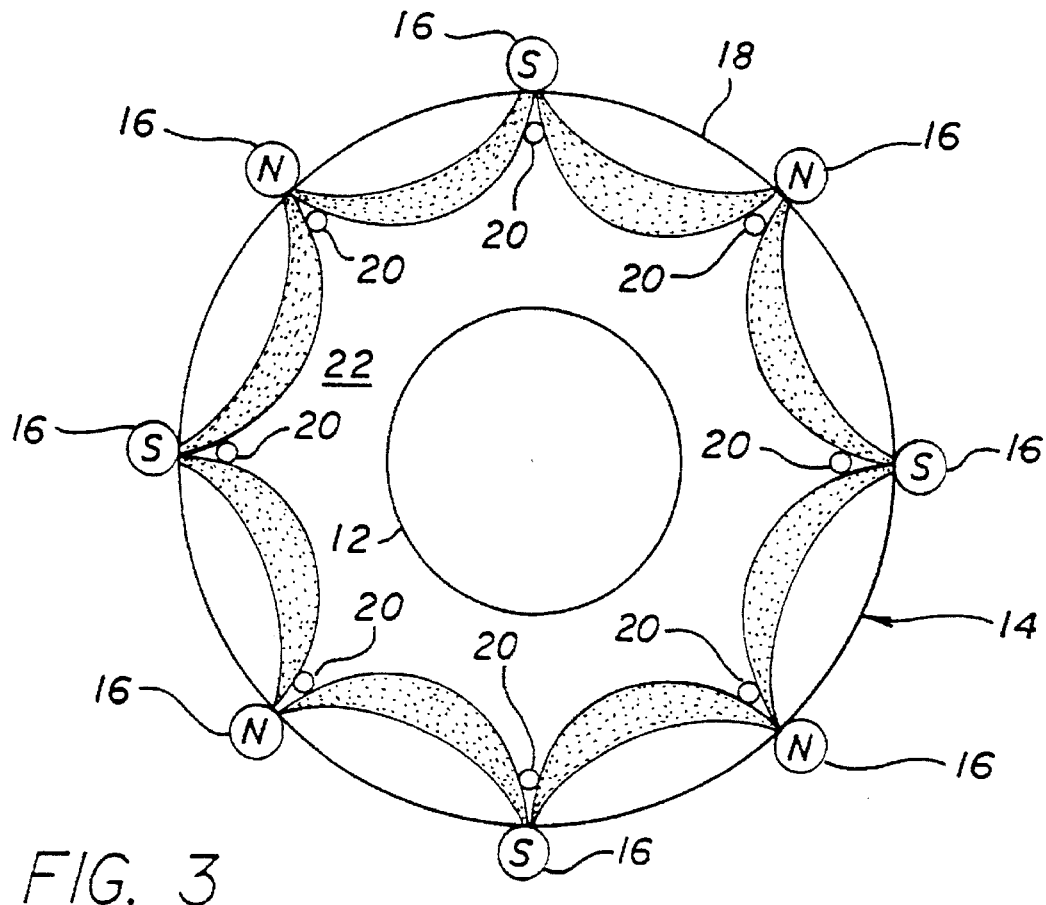
FIG. 3 is a schematic diagram of a distributed cyclotron resonance (DECR) reactor which is used as an etch chamber in the practice of the invention.

A schematic of a distributed electron cyclotron resonance (DECR) reactor 14 which is used as an etch chamber for this invention is depicted in FIG. 3. Eight permanent magnets 16 (about 1 Kgauss and having approximate dimensions of 10 mm width, 10 mm thickness, and 150 mm length) are attached symmetrically with alternate magnetic poles as shown in FIG. 3 on the outside of the cylindrical chamber wall 18 of the reactor 14.

A set of antennae 20 is placed inside of the chamber 22, very close to the wall 18. Microwave (2.45 GHz) power is transmitted through the antennae 20. The antennae comprise 10 mm diameter rods, arranged parallel to the chamber wall 18. This configuration permits the electrons to absorb the energy and hence give rise to high density plasma.

The bottom of the antennae 20 and magnets 16 are at the same plane as the surface of the wafer 12. The antennae and magnets are placed perpendicular to the surface of the wafer.

Figure 4:
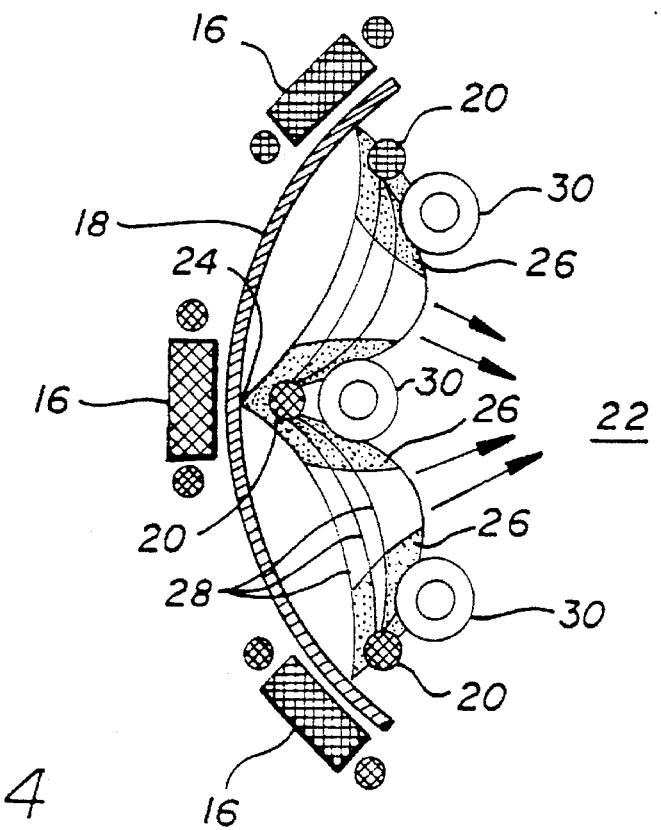
FIG. 4 is an sectional portion of FIG. 3, depicting the magnetic fields and electron cyclotron resonances employed in the practice of the invention.

The conditions for energy absorption via electron cyclotron resonance are satisfied at the magnetic cusps 24 where the magnetic field strength is 875 gauss. This is illustrated in FIG. 4 as the shaded areas 26 where electron cyclotron resonance occurs. It is believed that the ions produced in the DECR plasma will have substantial kinetic energy and consequently a much higher velocity (due to the fact that the charged species will be repelled by the magnetic field), as compared to the initial ion energy and ion velocity in conventional RF (radio frequency) cold plasmas. In most of the parallel plate reactive ion etch (RIE) systems, the velocity of the ions within the plasma is presumed nearly zero (which is a reasonable assumption) and the ions gain energy only in the dark space (also known as the plasma sheath very close to the wafer) due to the electropotential difference between the plasma potential $V_p$, which is positive, and the self, or external, bias potential $V_b$, which is negative.

However, from FIG. 4, one would expect that as soon as the gases dissociate to form ions, the magnetic lines of force (shown at 28) would repel the charged particles and consequently impart an energy/velocity to the ions. Since the wafer 12 is placed in the center of the chamber 22 in DECR systems, away from the ECR plasma source 30, it is reasonable to believe that the ions arriving at the wafer will have a parabolic trajectory which could be modified by applying an additional external bias potential. An external RF source (not shown) is used for supplying the needed bias on wafers, and controlling the ion energies incident to the wafer surface.

In this invention, the inventors have demonstrated that by selecting appropriate process parameters, the trajectory of the ions can be controlled such that the reaction/sputter yield is nearly zero when the locus of the ion is parallel to the resist pattern with wall angle of 90°, and the reaction/sputter yield is maximum when the surface is perpendicular to the incident ion.

The process of the invention has a number of useful applications. In addition to being a key component of an electrical wall angle measurement scheme, SITE may also be used as a resist profile sharpening technique. The process of the invention may also be used to improve overall depth of focus and exposure latitude for a masking process or process latitude for a pattern transfer process.

EXAMPLES

Example 1

Surface Image Transfer Etch for Photoresist

A thin (approximately 200Å) barrier oxide was grown on two 100 mm silicon wafers (wafer 1 and wafer 2) in an oxidation furnace. About 1,800Å of polysilicon was deposited onto the wafers using low pressure chemical vapor deposition (LPCVD). The polysilicon was doped with $POCl_3$, and the phosphorus was activated with a furnace cycle. The substrates were then vapor primed with HMDS (hexamethyldisilizane), and then coated with 1.01 μm of Shipley System 9D1L photoresist. The coated wafers were exposed on an ASM 5000/50 i-line stepper. The test reticle pattern was designed for producing electrical linewidth structures in the polysilicon after etching the resist mask. These are generally known as "prometrix electrical test structures" to those knowledgeable in the art. The test reticle was stepped in a focus X exposure pattern on the photoresist-coated wafer, and developed by conventional means. The wafers were DUV-stabilized with a Fusion model PC150.

Wafer 2 was etched in a distributed electron cyclotron resonance (DECR) etcher made by Alcatel with the following process chemistry:

Flow rates:

$Cl_2$: 5.0 sccm $N_2$: 10.0 sccm $O_2$: 2.1 sccm

Bias voltage: 39 volts or 70 volts

Power: 1000 watts

Pressure: 0.859 mTorr

Etch time: 150 sec.

It will be appreciated that HBr can be used in place of $Cl_2$ and that oxygen may be omitted if desired.

Scanning electron micrographs of 0.5 μm lines/spaces before SITE and after SITE demonstrated that the SITE etch had transferred the top CD all the way down through the bulk of the photoresist.

Table Ia indicates the electrical linewidth measurements corresponding to 0.6 μm dense lines/spaces printed in photoresist and etched into a conductor. The columns and rows of the Table correspond to different focus and exposure settings used to print the reticle. The area inside the lined border indicates the number of different focus X exposure combinations that will produce a linewidth within a specified tolerance, in this case, all critical dimensions lying between about 0.4 μm and 0.6 μm. Essentially, the area represents the total focus X exposure process window where the mask feature (in this case, 0.6 μm dense lines/spaces) can be printed on the wafer within a specified tolerance (0.4 to 0.6 μm).

If the wafer of Table Ia is first given a SITE before doing the pattern transfer etch into the conductor, then critical dimensions in Table Ib result. As was done in Table Ia, a border is drawn around the focus X exposure combinations meeting the (approximately) 0.4 μm to 0.6 μm cd tolerance. It is important to note that the area, or process window, is much larger after the SITE (compare Tables Ia and Ib).

TABLE I

Electrically Measured Critical Dimension for Wafers 1 and 2.

Ia. Wafer 1 - Bottom CD

| 1.000 | 2.000 | 3.000 | 4.000 | 5.000 | 6.000 | 7.000 | 8.000 | 9.000 | 10.000 | 11.000 |
|---|---|---|---|---|---|---|---|---|---|---|
| 1.200 | 1.200 | 1.200 | 1.200 | 1.200 | 1.200 | 1.200 | 1.200 | 1.200 | 1.200 | 1.200 |
| 1.200 | 1.200 | 1.200 | 1.200 | 1.200 | 1.200 | 1.200 | 1.200 | 1.200 | 1.200 | 1.200 |
| 1.200 | 1.200 | 1.200 | 1.200 | 0.709 | 0.690 | 1.200 | 1.200 | 1.200 | 1.200 | 1.200 |
| 1.200 | 1.200 | 1.200 | 0.604 | 0.588 | 0.596 | 0.608 | 0.643 | 0.728 | 1.200 | 1.200 |
| 1.200 | 0.537 | 0.547 | 0.519 | 0.502 | 0.501 | 0.501 | 0.510 | 0.529 | 1.200 | 0.000 |
| 0.000 | 0.472 | 0.483 | 0.477 | 0.468 | 0.465 | 0.470 | 0.422 | 0.392 | 0.000 | 0.000 |
| 0.426 | 0.434 | 0.446 | 0.450 | 0.436 | 0.429 | 0.389 | 0.362 | 0.000 | 0.000 | 0.000 |
| 0.380 | 0.369 | 0.407 | 0.416 | 0.428 | 0.385 | 0.331 | 0.000 | 0.000 | 0.000 | 0.000 |
| 0.000 | 0.297 | 0.360 | 0.384 | 0.386 | 0.388 | 0.293 | 0.000 | 0.000 | 0.000 | 0.000 |
| 0.000 | 0.294 | 0.346 | 0.366 | 0.365 | 0.363 | 0.332 | 0.283 | 0.258 | 0.000 | 0.000 |
| 0.000 | 0.323 | 0.352 | 0.364 | 0.359 | 0.341 | 0.259 | 0.000 | 0.000 | 0.000 | 0.000 |

TABLE I-continued

Electrically Measured Critical Dimension for Wafers 1 and 2.

Ib. Wafer 2 - Top CD

| 1.000 | 2.000 | 3.000 | 4.000 | 5.000 | 6.000 | 7.000 | 8.000 | 9.000 | 10.000 | 11.000 |
|---|---|---|---|---|---|---|---|---|---|---|
| 1.200 | 1.200 | 1.200 | 1.200 | 1.200 | 1.200 | 1.200 | 0.709 | 1.200 | 1.200 | 1.200 |
| 1.200 | 1.200 | 1.200 | 1.200 | 0.667 | 0.663 | 0.663 | 1.200 | 0.667 | 0.674 | 0.682 |
| 1.200 | 1.200 | 0.611 | 0.612 | 0.632 | 0.627 | 0.623 | 0.565 | 0.547 | 0.555 | 0.514 |
| 0.000 | 0.500 | 0.560 | 0.562 | 0.570 | 0.557 | 0.554 | 0.553 | 0.489 | 0.405 | 0.000 |
| 0.000 | 0.429 | 0.502 | 0.519 | 0.524 | 0.522 | 0.506 | 0.478 | 0.406 | 0.000 | 0.000 |
| 0.000 | 0.000 | 0.457 | 0.478 | 0.493 | 0.486 | 0.414 | 0.417 | 0.395 | 0.000 | 0.926 |
| 0.000 | 0.000 | 0.348 | 0.454 | 0.467 | 0.453 | 0.383 | 0.315 | 0.000 | 0.000 | 0.000 |
| 0.000 | 0.000 | 0.000 | 0.425 | 0.441 | 0.415 | 0.398 | 0.000 | 0.000 | 0.000 | 0.000 |
| 0.000 | 0.000 | 0.000 | 0.000 | 0.397 | 0.396 | 0.355 | 0.000 | 0.000 | 0.000 | 0.000 |
| 0.000 | 0.000 | 0.000 | 0.000 | 0.385 | 0.362 | 0.312 | 0.351 | 0.289 | 0.000 | 0.000 |
| 0.000 | 0.000 | 0.000 | 0.000 | 0.000 | 0.355 | 0.000 | 0.000 | 0.000 | 0.000 | 0.000 |

Although the foregoing example has largely pertained to SITE of photoresist, similar results may be obtained with etching inorganic films, such as polysilicon, $Si_2O$, and $Si_3N_4$, or intermediate composition films (such as silicon containing organic films ).

INDUSTRIAL APPLICABILITY

The surface image transfer etch process of the invention is expected to find use in semiconductor processing.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A process for transferring a defined pattern formed on a top surface of a layer comprising a first material to an underlying region of said first material without using a mask, said layer formed over a substrate having a surface, said process comprising:

(a) supporting said substrate in a chamber of a plasma reactor, said layer having been previously patterned to form three-dimensional structures in said first material at least portions of which have sloping sidewalls, said substrate having no said mask on said top surface of said layer;

(b) dissociating a gas to provide a plasma of ions;

(c) imparting an energy/velocity to said ions toward said substrate along defined trajectories;

(d) biasing said substrate to thereby control ion energies incident on said substrate; and (e) transforming said sloping sidewalls into vertical sidewalls by controlling said defined trajectories to sputter-etch surfaces of said layer with said ions such that surfaces of said layer not normal to said ion trajectory are etched at a faster rate than surfaces of said layer that are normal to said ion trajectory.

2. The process of claim 1 wherein said etch steps are performed in a distributed electron cyclotron resonance reactor in a chamber provided with magnets on the outside of said chamber with alternating magnetic poles from one magnet to the next and with antennae on the inside of said chamber and operatively associated with said magnets, with the bottom of said magnets and said antennae at the same plane as said substrate and with said magnets and said antennae perpendicular to said surface of said substrate.

3. The process of claim 2 wherein magnetic means are employed to impart an energy/velocity to said ions and wherein radio frequency means are employed for biasing.

4. The process of claim 1 wherein said defined pattern formed on said top surface of said layer is transferred to underlying first material by etching into said first material after transforming said sloping sidewalls into vertical sidewalls.

5. The process of claim 1 wherein said defined pattern formed on said top surface of said layer is transferred to an underlying second material by etching into said second material.

6. The process of claim 5 wherein said second material comprises a semiconductor material and said first material comprises a patternable material.

7. The process of claim 6 wherein said patternable material is selected from the group consisting of photoresist, an inorganic film, or an intermediate composition film.

8. The process of claim 7 wherein said inorganic film is selected from the group consisting of polysilicon, $Si_2O$, and $Si_3N_4$.

9. The process of claim 7 wherein said intermediate composition comprises a silicon containing organic film.

10. A process for transferring a defined pattern formed on the top surface of a first layer comprising a first material to an underlying second layer comprising a second material, without using a said second layer formed over a substrate having a surface, said process comprising:

(a) supporting said substrate in a chamber of a plasma reactor, said first layer having been previously patterned to form three-dimensional structures in said first material at least portions of which have sloping sidewalls, said top surface of said first layer having no said mask formed thereon;

(b) dissociating a gas to provide a plasma of ions;

(c) imparting an energy/velocity to said ions toward said substrate along defined trajectories;

(d) biasing said substrate to thereby control ion energies incident on said substrate;

(e) transforming said sloping, sidewalls into vertical sidewalls without using any said mask by controlling said defined trajectories to sputter-etch surfaces of said first layer with said ions such that surfaces of said first layer not normal to said ion trajectory are etched at a faster rate than surfaces of said first layer that are normal to said ion trajectory; and (f) transferring said defined pattern formed on said top surface of said first layer to said underlying second material by etching into said second material.

11. The process of claim 10 wherein said etch steps are performed in a distributed electron cyclotron resonance reactor in a chamber provided with magnets on the outside of said chamber with alternating magnetic poles from one magnet to the next and with antennae on the inside of said chamber and operatively associated with said magnets, with the bottom of said magnets and said antennae at the same plane as said substrate and with said magnets and said antennae perpendicular to said surface of said substrate.

12. The process of claim 11 wherein magnetic means are employed to impart an energy/velocity to said ions and wherein radio frequency means are employed for biasing.

13. The process of claim 10 wherein said second material comprises a semiconductor material and said first material comprises a patternable material.

14. The process of claim 13 wherein said patternable material is selected from the group consisting of photoresist, an inorganic film, or an intermediate composition film.

15. The process of claim 14, wherein said inorganic film is selected from the group consisting of polysilicon, $SiO_2$, and $Si_3N_4$.

16. The process of claim 14 wherein said intermediate composition comprises a silicon containing organic film.

* * * * *